United States Patent
Wu et al.

(10) Patent No.: US 9,147,728 B2
(45) Date of Patent: Sep. 29, 2015

(54) SEMICONDUCTOR NANOSTRUCTURE

(75) Inventors: Jian Wu, Beijing (CN); Zheng Liu, Beijing (CN); Wen-Hui Duan, Beijing (CN); Bing-Lin Gu, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 656 days.

(21) Appl. No.: 12/842,195

(22) Filed: Jul. 23, 2010

(65) Prior Publication Data

US 2011/0127639 A1    Jun. 2, 2011

(30) Foreign Application Priority Data

Nov. 27, 2009   (CN) .......................... 2009 1 0188569

(51) Int. Cl.
| | | |
|---|---|---|
| H01L 29/12 | (2006.01) | |
| H01L 29/06 | (2006.01) | |
| B82Y 10/00 | (2011.01) | |
| H01L 29/04 | (2006.01) | |
| H01L 29/15 | (2006.01) | |

(52) U.S. Cl.
CPC ............ H01L 29/0665 (2013.01); B82Y 10/00 (2013.01); H01L 29/045 (2013.01); H01L 29/15 (2013.01)

(58) Field of Classification Search
CPC .... B82Y 10/00; H01L 29/15; H01L 29/0665; H01L 29/045
USPC .......... 257/613, 622, 627, E29.004, E29.005, 257/E29.068
See application file for complete search history.

(56) References Cited

U.S. PATENT DOCUMENTS

| | | | |
|---|---|---|---|
| 5,514,619 A * | 5/1996 | Wakabayashi et al. | ......... 438/44 |
| 2006/0140569 A1 | 6/2006 | McDonald | |
| 2007/0029643 A1 | 2/2007 | Johnson et al. | |
| 2007/0259492 A1 * | 11/2007 | Roh et al. | ....................... 438/238 |
| 2008/0135888 A1 | 6/2008 | Lee et al. | |
| 2009/0242990 A1 * | 10/2009 | Saitoh et al. | ................... 257/351 |

FOREIGN PATENT DOCUMENTS

TW            200711240            3/2007

OTHER PUBLICATIONS

"Quantum confinement of crystalline silicon nanotubes with nonuniform wall thickness: Implication to modulation doping", Appl. Phys. Lett, B. Yan et al, vol. 91, p. 103107(2007).

* cited by examiner

*Primary Examiner* — Vongsavanh Sengdara
(74) *Attorney, Agent, or Firm* — Novak Druce Connolly Bove + Quigg LLP

(57) ABSTRACT

The present disclosure relates to a semiconductor nanostructure. The semiconductor nanostructure includes a substrate and at least one ridge. The substrate includes a first crystal plane and a second crystal plane perpendicular to the first crystal plane. The at least one ridge extends from the first crystal plane along a crystallographic orientation of the second crystal plane. A width of cross section at a position of half the height of the at least one ridge is less than 17 nm. The semiconductor nanostructure is a patterned structure which can lead to generate a quantum confinement effect, such that the impurity scattering phenomenon is reduced.

18 Claims, 3 Drawing Sheets

SEMICONDUCTOR NANOSTRUCTURE

CROSS-REFERENCE TO RELATED APPLICATIONS

This application claims all benefits accruing under 35 U.S.C. §119 from China Patent Application No. 200910188569.4, filed on Nov. 27, 2009, in the China Intellectual Property Office, the contents of which are hereby incorporated by reference.

BACKGROUND

1. Technical Field

The present disclosure relates to semiconductor nanostructures, and particularly to a two-dimensional semiconductor nanostructure.

2. Description of Related Art

In the past few decades, transistors are continuously scaled down in size, which has led to significant improvements in the field of miniature semiconductor electronic devices. Presently, the metal oxide semiconductor field effect transistors (MOSFETs) have been scaled down to the nanometer scale. Unfortunately, varieties of problems emerge when the size of MOSFETs approaches the nanometer scale. One of these problems is that carrier (electron and/or hole) mobility of semiconductor nanostructures in MOSFETs becomes low when the size of MOSFETs is reduced. Currently, the semiconductor nanostructures in MOSFETs are made of film shaped silicon. An approach for increasing the carrier mobility is commonly carried out by introducing an appropriate strain to change the dimensions of the lattice. The energy bands of the semiconductor nanostructures are changed with respect to the changes of the dimensions of the lattice, and the changes of the energy bands may increase the carrier mobility. However, in the approach above, impurity scattering that restricts the carrier mobility is not taken into account. The impurity scattering means that carriers can scatter as they travel through the impurity atoms. In detail, as the carriers travel through impurity atoms, a Coulomb interaction generates between the carriers and the impurity atoms. Therefore, the carriers and the impurity atoms can be mutually attrahent or exclusive, such that the motion directions of the carriers change, thereby decreasing the carrier mobility.

As disclosed by a prior art, the impurity scattering phenomenon in doped one-dimensional silicon nanotubes is not obvious. The nonuniformity of wall thickness of the silicon nanotubes can cause quantum confinement effect. The carriers are located in the thicker wall of the silicon nanotubes. N-type or P-type doping elements for increasing the concentration of the carries (e.g., electrons or holes) are confined in the thinner wall. Thus, the doping elements and the carriers are spatially separated from each other, such that the impurity scattering phenomenon is reduced, thereby increasing the carrier mobility.

However, the reduction principle of the impurity scattering in the one-dimensional silicon nanotubes cannot be applied for reducing the impurity scattering in a two-dimensional semiconductor nanostructure. Therefore, it is not an approach for decreasing the impurity scattering of the two-dimensional semiconductor nanostructure.

What is needed, therefore, is to provide a two-dimensional semiconductor nanostructure having relatively high carrier mobility due to reduction of the impurity scattering.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

One embodiment of a semiconductor nanostructure includes a substrate and at least one ridge. The substrate includes a first crystal plane and a second crystal plane perpendicular to the first crystal plane. Then at least one ridge extends from the first crystal plane along a crystallographic orientation of the second crystal plane. The crystallographic orientation of the first crystal plane is (001) or (110). The crystallographic orientation of the second crystal plane is (110) or (001). Specifically, if the crystallographic orientation of the first crystal plane is (001), the crystallographic orientation of the second crystal plane is (110). If the crystallographic orientation of the first crystal plane is (110), the crystallographic orientation of the second crystal plane is (001).

Figure 1:
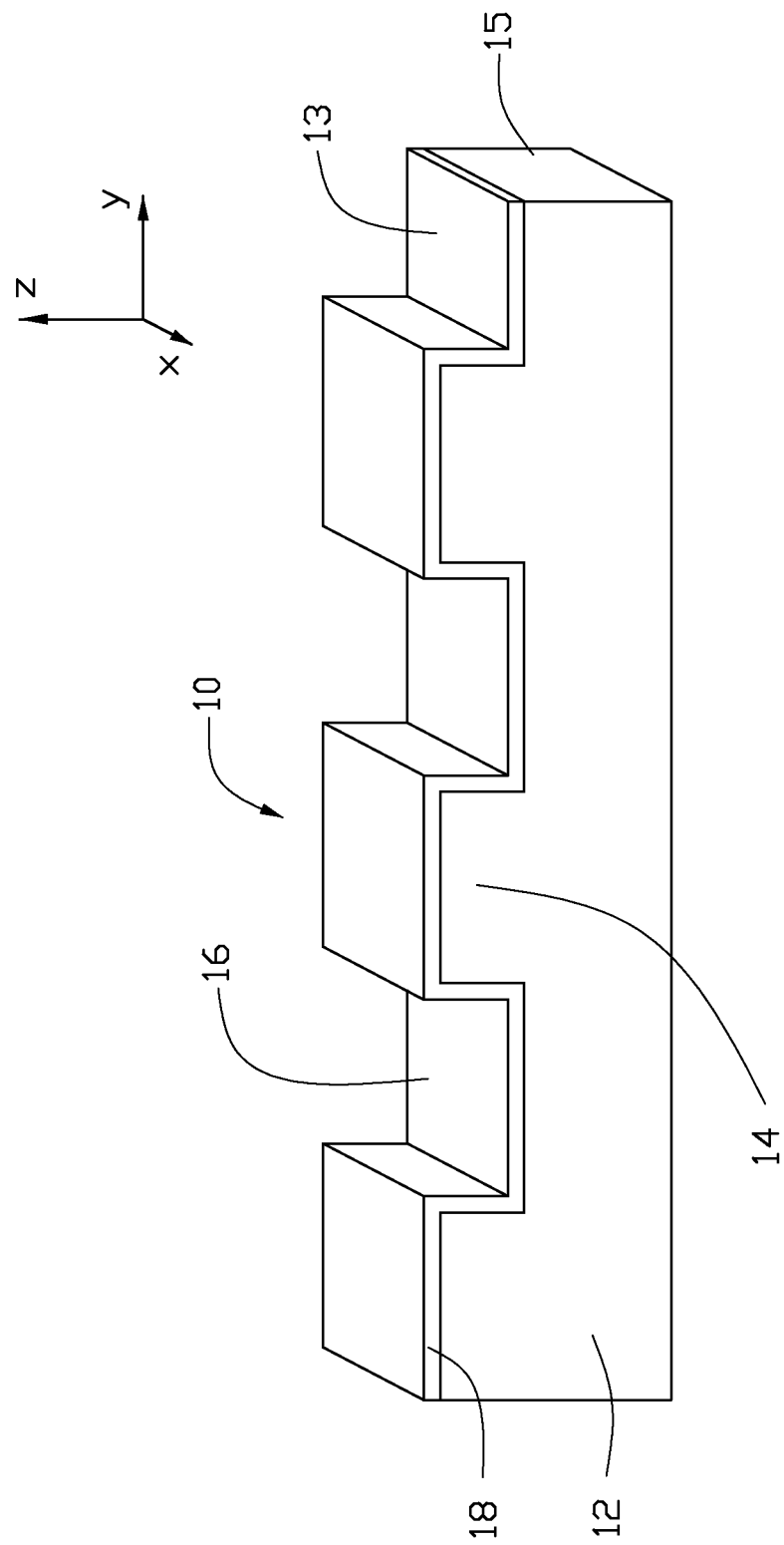
FIG. 1 is a schematic structural view of one embodiment of a semiconductor nanostructure.

Referring to FIG. 1, a first embodiment of semiconductor nanostructure 10 includes a substrate 12, a plurality of ridges 14 and a plurality grooves 16. The substrate 12 includes a first crystal plane 13 being a first surface having a crystallographic orientation (110), and a second crystal plane 15 being a second surface having a crystallographic orientation (001). The ridges 14 extend from the first crystal plane 13 along the crystallographic orientation (001) of the second crystal plane 15. The ridges 14 are continuously disposed on the substrate 12 along the length orientation of substrate 12 and spaced from each other. Each groove 16 is defined by two adjacent ridges 14.

The substrate 12 can be composed of a plurality of atom layers of semiconducting material. The atom layers can overlap each other. The material of the substrate 12 can be silicon (Si), germanium (Ge), carborundum (SiC), or silica gel (SiGe). The shape of the substrate 12 may be a film structure. The thickness direction of the film structure is equivalent to z axis direction of FIG. 1, the width direction of the film structure is equivalent to x axis direction of FIG. 1, and the length direction of the film structure is equivalent to y axis direction of FIG. 1. The width and the length of the substrate 12 can be set as desired. The thickness of the substrate 12 can be set by the following principle. The thickness of the substrate 12 should be properly small to induce energy level changes to the substrate 12, thereby emerging quantum confinement effect in the substrate 12, which makes holes confined in the substrate 12. The thickness of the substrate 12 can be smaller than 17 nanometers (nm), such as in a range from about a thickness of five atom layers to about a thickness of fifteen atom layers, wherein the atom layers are composed of the material of the substrate 12. In one embodiment, the substrate 12 is a single crystal silicon film composed of eight silicon atom layers, namely, the thickness of the substrate 12 is 13.4 Å.

The ridges 14 can be integral with the substrate 12. The material of the ridges 14 is the same as the material of the substrate 12. In one embodiment, the material of the ridges 14 is single crystal silicon if the material of the substrate 12 is single crystal silicon. Furthermore, acceptor doping atoms can be doped into the ridges 14. The acceptor doping atoms can be atoms of boron (B), indium (In), or gallium (Ga). Concentration of the acceptor doping atoms can be set as desired. The acceptor doping atoms can increase the hole concentration in the semiconductor nanostructure 10, such that the semiconductor nanostructure 10 turns to P-type semiconductor nanostructure.

In one embodiment, boron atoms are doped in the ridges 14. The acceptor doping atoms and the holes provided by the doping atoms can be separated from each other according to modulation doping technique. More specifically, the doping atoms can be distributed in the ridges 14, and the holes provided by the doping atoms are mostly distributed in the substrate 12.

The shape of the ridges 14 can be set as desired. The height direction of the ridges 14 is equivalent to z axis direction. The height of the ridges 14 can be higher than one fifteenth of a width of the ridges 14. In one embodiment, the height of the ridges 14 is higher than the thickness of 4 atoms layers, wherein the atom layers are composed of the material of the ridges 14. The higher the ridges 14, the more the content of the doping atoms doped in the ridges 14, and the more the holes provided by the doping atoms. The holes provided by the doping atoms can be confined in the substrate 12 according to quantum confinement effect, such that the concentration of the holes in the substrate 12 can be increased. The width direction of the ridges 14 is equivalent to y axis direction, the width and the length of the ridges 14 can be regarded as the width and the length of the cross section of the ridges 14 at the position of half of the height. The width of the cross section at the position of the half of the height of the ridges 14 can be less than 17 nanometers (nm). Additionally, the widths of the individual ridges 14 can be same or different. The length direction of the cross section at the position of the half of the height of the ridges 14 is equivalent to x axis direction, and the length of the cross section can be set as desired.

In one embodiment, the ridges 14 are cube shaped. The height of the ridges 14 is equivalent to the thickness of four atom layers, namely, the height of the ridges 14 is 5.5 Å. The length of the ridges 14 and the width of the substrate 12 can be the same or different. In one embodiment, the length of the ridges 14 and the width of the substrate 12 are same.

Figure 2:
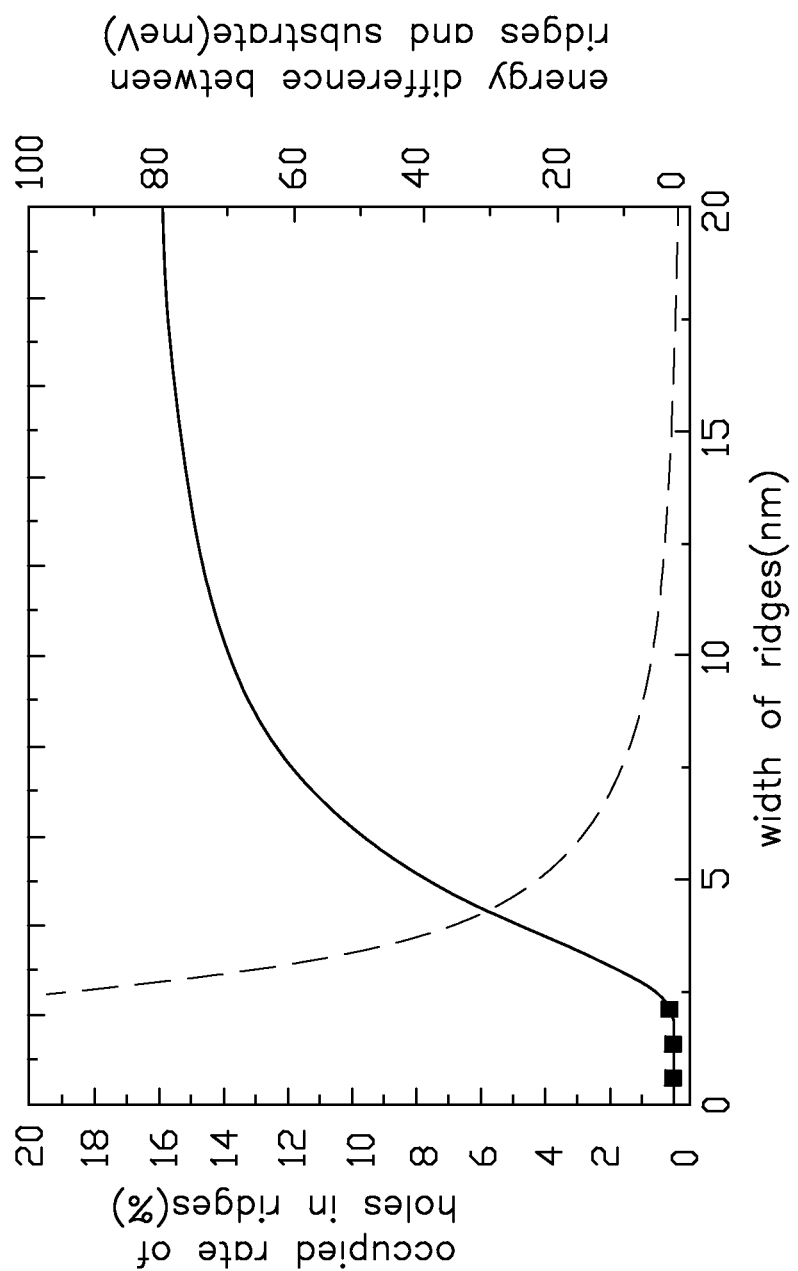
FIG. 2 is a diagram showing a relationship between holes occupied rate in ridges, energy difference between the ridges and the substrate, and width of top surface of the ridge.

Referring to FIG. 2, the dash line indicates the relation between the width of the ridges 14 and the energy difference between the ridges 14 and the substrate 12. FIG. 2 shows that the width of the ridges 14 is inversely proportional to the energy difference between the ridges 14 and the substrate 12. More specifically, the smaller the width of the ridges 14, the greater the energy difference between the ridges 14 and the substrate 12, and the more significant the quantum confinement effect. Thus, the holes are intensively confined in the substrate 12, thereby increasing the hole mobility. When the width of the ridges 14 is smaller than 17 nm, the above principle is more significant. The solid line indicates the relation between the width of the ridges 14 and the occupied rate of the holes in the ridges 14. FIG. 2 shows that the width of the ridges 14 is proportional to the occupied rate of the holes in the ridges 14. More specifically, the greater the width of the ridges 14, the greater the occupied rate of the holes in the ridges 14. When the width of the ridges 14 is less than 17 nm, the occupied rate of the holes in the ridges 14 is less than 16%. Thus, the phenomenon of the quantum confinement effect is significant. The holes of a relatively small percentage provided by the doping atoms are distributed in the ridges 14, and most holes are distributed in the substrate 12. Additionally, most doping atoms are located in the ridges 14. Therefore, the doping atoms and the holes are spatially separated from each other to decrease the impurity scattering of the holes, thereby increasing the hole mobility. Thus, the smaller of the width of the ridges 14, the fewer the impurity scattering of the holes, and the higher the hole mobility. The width of the ridges 14 should be less than 17 nm, such as in a range from about 0.6 nm to about 2.1 nm, in one embodiment, the width of the ridges 14 is 1 nm.

The width of the grooves 16 can be set to insure that there is no interaction between the adjacent ridges 14, such that the holes of the ridges 14 only move between the ridges 14 and the substrate 12, but do not move between the ridges 14. The width direction of the grooves 16 is equivalent to y axis direction. The width of the grooves 16 can be greater than 1 nm. In one embodiment, the width of the grooves 16 is greater than the thickness of ten atom layers.

The semiconductor nanostructure 10 is a patterned structure which can lead to generate the quantum confinement effect, such that the distribution of the holes is modulated, and the holes are intensively restricted in the substrate 12. The ridges 14 extend from the first crystal plane 13 along the crystallographic orientation (001) of the second crystal plane. The extending direction of the ridges 14 can lead to that the energy bands of the substrate 12 and the energy bands of the ridges 14 are anisotropy. The valence band maximum of the semiconductor nanostructure 10 is intensively restricted in the substrate 12, especially, when a band-folding effect can be induced in the energy bands of the semiconductor nanostructure 10. Each energy band is divided into a first valence subband and a second valence subband. A wide forbidden band is formed between the valence band maximum and the second valence subband of each energy band. The first valence subband has a same spatial distribution with the valence band maximum. Thus, the holes hardly transfer through the forbidden band, and the motion of the holes is controlled by the first valence subband around the valence band maximum. Accordingly, the holes in the semiconductor nanostructure 10 are mostly distributed in the substrate 12.

Furthermore, the semiconductor nanostructure 10 can include a protective layer 18. The protective layer 18 can cover the entire surface of the semiconductor nanostructure 10. Additionally, the protective layer 18 can only cover the top surface with the ridges 14 and the grooves 16, thereby avoiding inducing lattice relaxation and decreasing the physical property of the whole semiconductor nanostructure 10. In one embodiment, the protective layer 18 is a hydrogen atom layer.

In addition, the number of the ridges 14 of the semiconductor nanostructure 10 can only be one. The number of the ridges 14 can be set according to the corresponding concentration of the holes in the semiconductor nanostructure. Specifically, the more the desired hole concentration, the more the number of the ridges 14, and the more the doping atoms, and vice versa.

Figure 3:
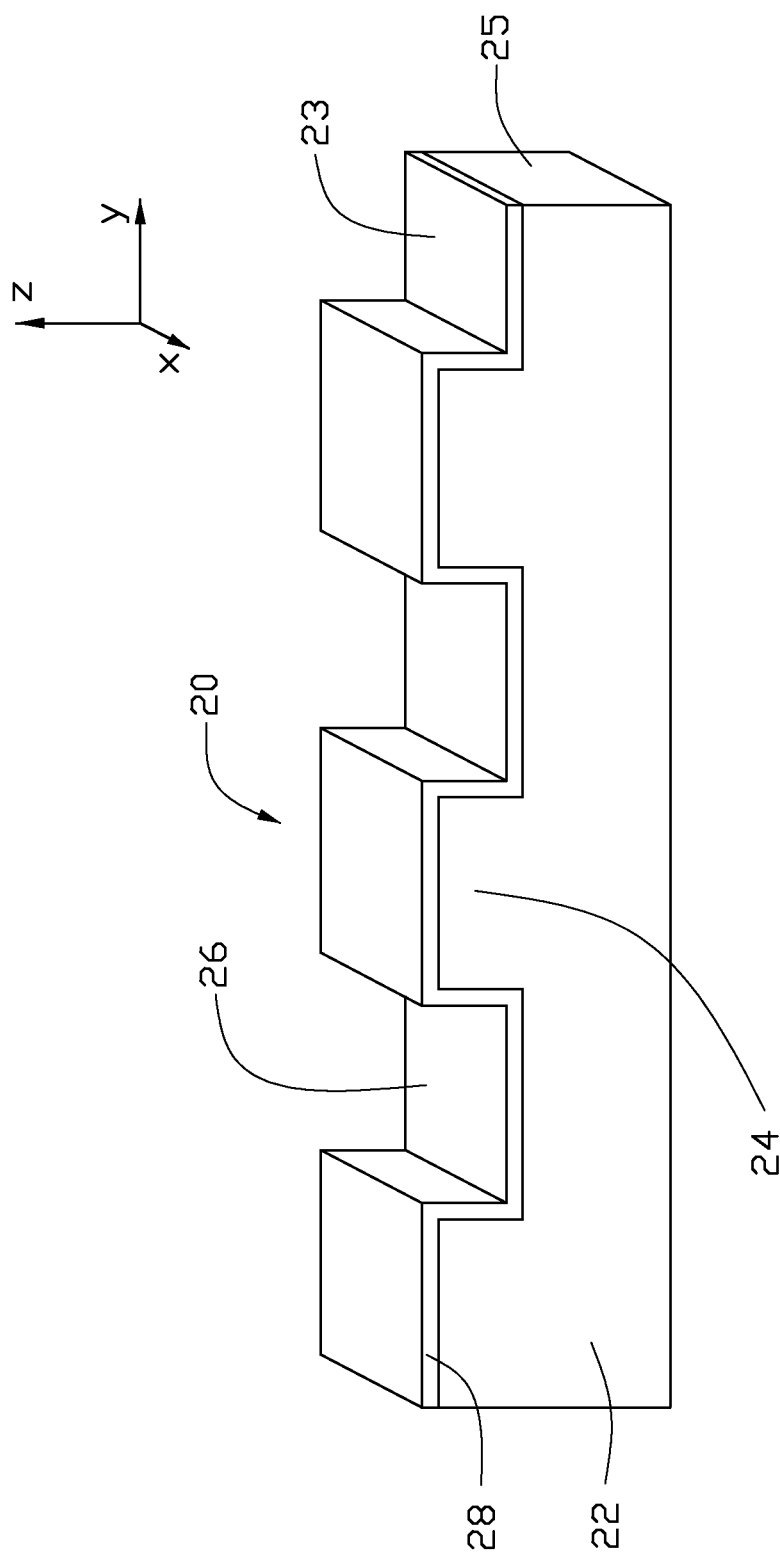
FIG. 3 is a schematic structural view of another one embodiment of a semiconductor nanostructure.

Referring to FIG. 3, one another embodiment of the semiconductor nanostructure 20 includes a substrate 22, a plurality of ridges 24, and a plurality of grooves 26. The substrate 22 includes a first crystal plane 23 being a first surface having a crystallographic orientation (001), and a second crystal plane 25 being a second surface having a crystallographic orientation (110). The ridges 24 extend from the first crystal plane 23 along the crystallographic orientation (110) of the second crystal plane 25. The ridges 24 are continuously disposed on the substrate 22 along the length orientation of substrate 22 and spaced apart from each other. The grooves 26 are defined by the two adjacent ridges 24.

Furthermore, the semiconductor nanostructure 20 includes a protective layer 28. The protective layer 28 covers the top surface with the ridges 14 and the grooves 16.

The material of the ridges 24 may be the same as the material of the substrate 22. Furthermore, donor doping atoms can be doped into the ridges 24. Concentration of the donor doping atoms can be set as desired. The donor doping atoms can be atoms of phosphor (P), arsenic (As), or stibium (Sb). The donor doping atoms can increase the electrons concentration of the semiconductor nanostructure 20, such that the semiconductor nanostructure 20 turns to N-type semiconductor nanostructure.

In addition, the dimension of the semiconductor nanostructure 20 is similar to the above semiconductor nanostructure 10.

The semiconductor nanostructure 20 is a patterned structure, which can induce that the energy bands of the substrate 22 and the energy bands of the ridges 24 are anisotropy, the anisotropy energy bands induce a quantum confinement effect. The valence band maximum of the semiconductor nanostructure 20 is intensively restricted in the substrate 22, such that the electrons are intensively restricted in the substrate 22. Specifically, a band-folding effect can be induced in the energy bands of the semiconductor nanostructure 20. The energy bands are divided into a first valence subband and a second valence subband, and the valence band maximum of the energy band is far away from the second valence subband, therefore, the width of the forbidden band between the valence band maximum and the second valence subband is wide. Thus, the electrons hardly transfer through the forbidden band, and the motion of the electrons are controlled by the first valence subband around the valence band maximum having a same spatial distribution as the first valence subband, which make the electrons in the semiconductor nanostructure 20 mostly distributed in the substrate 22. The electrons and the doping atoms are spatially separated from each other, thereby decreasing the impurity scattering and increasing the electrons mobility.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A semiconductor nanostructure comprising:
    a substrate comprising a first crystal plane and a second crystal plane substantially perpendicular to the first crystal plane; and
    at least one ridge extending from the first crystal plane along a crystallographic orientation of the second crystal plane, wherein a width of cross section at a position of half the height of the at least one ridge is less than 17 nm, and a thickness of the substrate is in a range from about a thickness of five atom layers to about a thickness of fifteen atom layers of a material of the substrate, and the substrate has a quantum confinement effect.

2. The semiconductor nanostructure as claimed in claim 1, wherein a crystallographic orientation of the first crystal plane is (110), and the crystallographic orientation of the second crystal plane is (001).

3. The semiconductor nanostructure as claimed in claim 2, further comprising doping atoms, wherein the doping atoms are doped in the at least one ridge, and the doping atoms are selected from the group consisting of boron, indium, gallium and any combination thereof 4. The semiconductor nanostructure as claimed in claim 1, wherein a crystallographic orientation of the first crystal plane is (001), and the crystallographic orientation of the second crystal plane is (110).

5. The semiconductor nanostructure as claimed in claim 4, further comprising doping atoms, wherein the doping atoms are doped in the at least one ridge, and the doping atoms are selected from the group consisting of phosphor, arsenic, stibium and any combination thereof 6. The semiconductor nanostructure as claimed in claim 1, wherein the at least one ridge comprises a plurality of ridges disposed on the substrate along a length of the substrate, and a plurality of grooves are defined by the plurality of ridges.

7. The semiconductor nanostructure as claimed in claim 6, wherein a width of each of the plurality of grooves is greater than 1 nm.

8. The semiconductor nanostructure as claimed in claim 1, further comprising a protective layer disposed on a top surface having the at least one ridge.

9. The semiconductor nanostructure as claimed in claim 8, the protective layer is a hydrogen atom layer.

10. The semiconductor nanostructure as claimed in claim 1, wherein the at least one ridge is integral with the substrate.

11. The semiconductor nanostructure as claimed in claim 1, wherein a height of the at least one ridge is higher than one fifteenth of a width of the at least ridge.

12. The semiconductor nanostructure as claimed in claim 1, wherein the width of the at least one ridge is in a range from about 0.6 nm to about 2.1 nm.

13. A semiconductor nanostructure comprising:
    a substrate comprising a first surface being a first crystal plane and a second surface being a second crystal plane substantially perpendicular to the first surface; and
    at least one ridge extending from the first crystal plane along a crystallographic orientation of the second crystal plane;
    wherein a material of the substrate is silicon, the at least one ridge comprises silicon and a plurality of P-type doping atoms dispersed in the silicon, a crystallographic orientation of the first crystal plane is (110), the crystallographic orientation of the second crystal plane is (001), a width of a cross section at a position of half the height of the at least one ridge is less than 17 nm.

14. The semiconductor nanostructure as claimed in claim 13, wherein the at least one ridge comprises a plurality of ridges, a plurality of grooves are defined by the plurality of ridges, a width of each of the plurality of grooves is greater than 1 nm.

15. The semiconductor nanostructure as claimed in claim 13, further comprising a protective layer disposed on a top surface having the at least one ridge, and the protective layer is a hydrogen atom layer.

16. The semiconductor nanostructure as claimed in claim 13, wherein a thickness of the substrate is in a range from about a thickness of five atom layers to about a thickness of fifteen atom layers of a material of the substrate, and the substrate has a quantum confinement effect.

17. A semiconductor nanostructure comprising:
a substrate comprising a first surface being a first crystal plane and a second surface being a second crystal plane substantially perpendicular to the first surface; and
a plurality of ridges extending from the first surface along a crystallographic orientation of the second crystal plane, and a plurality of grooves being defined by the plurality of ridges;
wherein a crystallographic orientation of the first crystal plane is (110), the crystallographic orientation of the second crystal plane is (001), and a width of a cross section at a position of half the height of the at least one ridge is less than 17 nm, and a thickness of the substrate is in a range from about a thickness of five atom layers to about a thickness of fifteen atom layers of a material of the substrate, and the substrate has a quantum confinement effect.

18. The semiconductor nanostructure as claimed in claim 17, wherein plurality of ridges are integral with the substrate.

* * * * *